(12) United States Patent
Iihama

(10) Patent No.: US 6,681,992 B2
(45) Date of Patent: Jan. 27, 2004

(54) IMAGE READING APPARATUS

(76) Inventor: Tomomi Iihama, 209, Monaku Fussa, 1975-2, Fussa, Fussa-shi, Tokyo (JP)

( * ) Notice: Subject to any disclaimer, the term of this patent is extended or adjusted under 35 U.S.C. 154(b) by 205 days.

(21) Appl. No.: 09/919,147

(22) Filed: Jul. 31, 2001

(65) Prior Publication Data

US 2002/0014530 A1 Feb. 7, 2002

(30) Foreign Application Priority Data

Aug. 3, 2000 (JP) .................................. 2000-235555
Sep. 13, 2000 (JP) .................................. 2000-277518

(51) Int. Cl.⁷ .............................. G06K 7/10; G06K 7/14
(52) U.S. Cl. ............................................... 235/454
(58) Field of Search .......................... 235/454, 462.11; 250/214 R

(56) References Cited

U.S. PATENT DOCUMENTS 4,827,084 A * 5/1989 Yaniv et al. ............. 178/18.05
6,414,297 B1 * 7/2002 Sasaki et al. ............ 250/214 R

FOREIGN PATENT DOCUMENTS

JP          218055          12/1993

* cited by examiner

Primary Examiner—Thien M. Le
Assistant Examiner—Lisa M. Caputo

(57) ABSTRACT

Provided is a two dimensional image reading apparatus capable of releasing appropriately the static electricity charged in a target object to be detected, which is disposed on a photosensor device, so as to markedly suppress the malfunction of reading and breakage of the device.

19 Claims, 16 Drawing Sheets

| STATIC ELECTRICITY PROTECTION CONDUCTIVE LAYER | | | LINE RESISTANCE (Ω) | GROUNDING RESISTANCE (Ω) | WITHSTAND VOLTAGE (-kV) |
|---|---|---|---|---|---|
| THICKNESS (nm) | SHEET RESISTANCE (Ω/□) | RESISTANCE (Ω) | | | |
| 50 | 50 | 36.6 | 0 | 36.6 | 7 |
| 100 | 30 | 19 | 16 | 35 | 9 |
| 150 | 20 | 13.6 | 22 | 35.6 | 9 |
| 200 | 15 | 9.9 | 27 | 36.9 | 8 |
| 200 | 15 | 8 | 27 | 35 | 8 |

FIG.18

| STATIC ELECTRICITY PROTECTION CONDUCTIVE LAYER | | | LINE RESISTANCE (Ω) | GROUNDING RESISTANCE (Ω) | WITHSTAND VOLTAGE (-kV) |
|---|---|---|---|---|---|
| THICKNESS (nm) | SHEET RESISTANCE (Ω/□) | RESISTANCE (Ω) | | | |
| 50 | 45 | 15 | 0 | 15 | 5 |
| 50 | 45 | 24 | 0 | 24 | 5 |
| 50 | 45 | 38 | 0 | 38 | 5 |
| 50 | 45 | 50 | 0 | 50 | 5 |

FIG.19

IMAGE READING APPARATUS

CROSS-REFERENCE TO RELATED APPLICATIONS

This application is based upon and claims the benefit of priority from the prior Japanese Patent Applications No. 2000-235555, filed Aug. 3, 2000; and No. 2000-277518, filed Sep. 13, 2000, the entire contents of both of which are incorporated herein by reference.

BACKGROUND OF THE INVENTION

1. Field of the Invention

The present invention relates to an image reading apparatus, particularly, to an image reading apparatus in which a target object to be detected is brought into contact with a photosensor array prepared by arranging a plurality of photosensors in a matrix so as to read an image pattern of the object.

2. Description of the Related Art

Known is a reading apparatus of a two dimensional image for reading, for example, fine irregularities of a printed material, a photograph, or a fingerprint, which is constructed such that a target object to be detected is disposed on or brought into contact with a detecting surface mounted to a photosensor array prepared by arranging a plurality of photoelectric converting elements in a matrix so as to read the two dimensional image of the target object.

In the two dimensional image reading apparatus of the construction that the target object is brought into direct contact with the detecting surface, there is a construction that the distance between the target object and the photoelectric converting element is short. In this case, the static electricity charged in the target object to be detected causes a driving circuit for driving the photoelectric converting elements to perform a malfunction or to be broken via the wiring of the photoelectric converting element, with the result that any photoelectric converting element itself tends to perform malfunction or to be broken.

In the conventional two dimensional image reading apparatus of the construction described above, a specific withstanding design of the means for releasing sufficiently and without fail the static electricity charged in the target object has not yet been established. Thus, the withstanding to the static electricity has not yet been achieved sufficiently. Such being the situation, it is impossible to prevent sufficiently the malfunction of the reading and the breakage of the two dimensional image reading apparatus caused by the static electricity.

Under the circumstances, it is of high importance to establish the specific construction and the forming conditions of the means capable of releasing appropriately the static electricity charged in the target object to be detected so as to prevent effectively the malfunction of reading, the breakage, etc. of the two dimensional image reading apparatus.

BRIEF SUMMARY OF THE INVENTION

An object of the present invention is to provide a two dimensional image reading apparatus capable of releasing appropriately a static electricity charged in a target object to be detected, which is disposed on a photosensor device, so as to markedly suppress the malfunction of reading and the breakage of the device.

According to a first aspect of the present invention, there is provided an image reading apparatus for reading an image of a target object, comprising a plurality of sensors arranged on one side of a substrate, an insulating film formed to cover the plurality of sensors, and a conductive layer formed on the insulating film for releasing the voltage charged in the target object, the conductive layer having a sheet resistance of 50 $\Omega/\square$ or less.

Where the target object is charged with a static electricity, the static electricity is released from the conductive layer having a low sheet resistance when the target object is brought into contact with the conductive layer so as to prevent the image reading apparatus from being broken by the static electricity.

Where the sensor may includes photosensors, it is desirable for the conductive layer to be formed of a conductive material, which transmits light. Particularly, it is desirable for the conductive layer to be formed of an ITO, i.e., a material based on indium.tin oxide. It should be noted, however, that attenuation caused by absorption and scattering of light also takes place within the ITO layer. It follows that, if the ITO layer is excessively thick, the reading sensitivity characteristics of the image pattern of the target object is deteriorated. Also, a long time is required for forming an ITO film having an excessively large thickness, leading to a low productivity. Under the circumstances, it is reasonable to form the conductive layer by using an ITO having a resistivity not higher than $2 \times 10^{-3}$ $\Omega \cdot$cm or less and a refractive index falling within a range of between about 2.0 and about 2.2, and it is desirable for the ITO film to have a thickness falling within a range of between about 50 nm and about 200 nm so as to set the sheet resistance of the ITO film at about 15 to 50 $\Omega/\square$. Where the highest priority is put on the productivity, it is reasonable for the ITO film to have a thickness falling within a range of between about 50 nm and 100 nm so as to set the sheet resistance at 30 to 50 $\Omega/\square$. On the other hand, where the highest priority is put on the charge releasing properties, it is desirable to set the thickness of the ITO film to fall within a range of between about 150 nm and 200 nm so as to set the sheet resistance at 15 to 20 $\Omega/\square$.

According to a second aspect of the present invention, there is provided an image reading apparatus for reading the image of a target object to be detected, comprising (a) a plurality of photosensors arranged on one surface of a substrate, each of the photosensors including a semiconductor layer having an incident effective region on which an excited light is incident, a source electrode and a drain electrode formed on both edge sides of the semiconductor layer, a first gate insulating film formed below the semiconductor layer, a first gate electrode formed under the first gate insulating film, a second gate insulating film formed above the semiconductor layer, and a second gate electrode formed above the second gate insulating film, (b) an insulating film formed to cover the plural sensors, (c) a conductive layer formed on the insulating layer for releasing the voltage charged in the target object, the conductive layer having a sheet resistance not higher than 50 $\Omega/\square$, (d) a drain driver connected the drain electrode of the plural photosensors, (e) a first gate driver connected to the first gate electrode of the plural photosensors, and (f) a second gate driver connected to the second gate electrode of the plural photosensors.

In order to prevent the light emitted from a back light arranged below from being incident directly on the semiconductor layer, the first gate electrode may be formed of a metal opaque to or reflecting the excited light. On the other hand, the second gate electrode may be formed of a transparent oxide conductor such as an ITO in order to permit the light emitted from the back light and incident on the target object to be detected and the light reflected from the target object to be transmitted through the second gate electrode. In general, since the metal has a resistivity lower than that of a transparent oxide conductor such as an ITO and, thus, is a good conductor, the metal tends to propagate easily the static electricity. Therefore, the static electricity tends to be concentrated more easily on the first gate driver than on the second gate driver so as to break the first gate driver. In the present invention, however, a conductive layer having a low sheet resistance is arranged so as to suppress the propagation of the static electricity to the driver so as to improve the withstand voltage.

According to a third aspect of the present invention, there is provided an image reading apparatus for reading the image of a target object to be detected, comprising a plurality of sensors arranged on one side of a substrate, an insulating film formed to cover the plural sensors, a conductive layer formed on the insulating film for releasing the voltage charged in the target object, the conductive layer having a sheet resistance not higher than 50 $\Omega/\square$, and an impact alleviating layer formed on the conductive layer.

Since a semiconductor having a resistance higher than that of the conductive layer for releasing the static electricity or an insulator is used for forming the impact alleviating layer, the image reading apparatus is allowed to achieve a high withstand voltage. In addition, where the target object is a part of the charged human body, it is possible to alleviate the unpleasantness felt by the human being when the electric charge is released.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 18 is a table showing the characteristics, the various resistance values and the withstand voltage of the static electricity protection conductive layer;

FIG. 19 is a table showing the withstand voltage corresponding to the position of the static electricity released from an electrostatic gun on the static electricity protection conductive layer of the static electricity;

DETAILED DESCRIPTION OF THE INVENTION

The two dimensional image reading apparatus according to some embodiments of the present invention will now be described in detail with reference to the accompanying drawings.

First of all, let us describe the construction of a photosensor that is satisfactory when applied to the two dimensional image reading apparatus of the present invention.

A solid-state image pickup device such as a CCD (Charge Coupled Device) can be used as a photosensor included in the two dimensional image reading apparatus of the present invention. As widely known to the art, the CCD is formed by arranging photosensors such as photodiodes or thin film transistors (TFT) in the form of a matrix. In the CCD, the amount of the electron-hole pairs (amount of charge) generated in accordance with the amount of light irradiating the light receiving section of each photosensor is detected by a horizontal scanning circuit and a vertical scanning circuit so as to detect the brightness of the irradiating light.

In the photosensor system using such CCD's, it is necessary to arrange separately selection transistors for putting each of the scanned photosensors in a selection state, giving rise to the problem that the system itself is rendered bulky in accordance with increase in the number of detected pixels.

Under the circumstances, a thin film transistor having a so-called "double gate structure" (hereinafter referred to as a "double gate type transistor"), in which the photosensor itself is allowed to perform the photosensor function and the selection transistor function, has been developed in recent years in an attempt to miniaturize the system and increase the density of the pixels. It is possible to apply effectively the double gate type transistor to the two dimensional image reading apparatus of the present invention.

The photosensor utilizing the double gate type transistors (hereinafter referred to as a "double gate type photosensors"), which can be applied to the two dimensional image reading apparatus of the present invention, will now be described with reference to the accompanying drawings.

Figure 1:
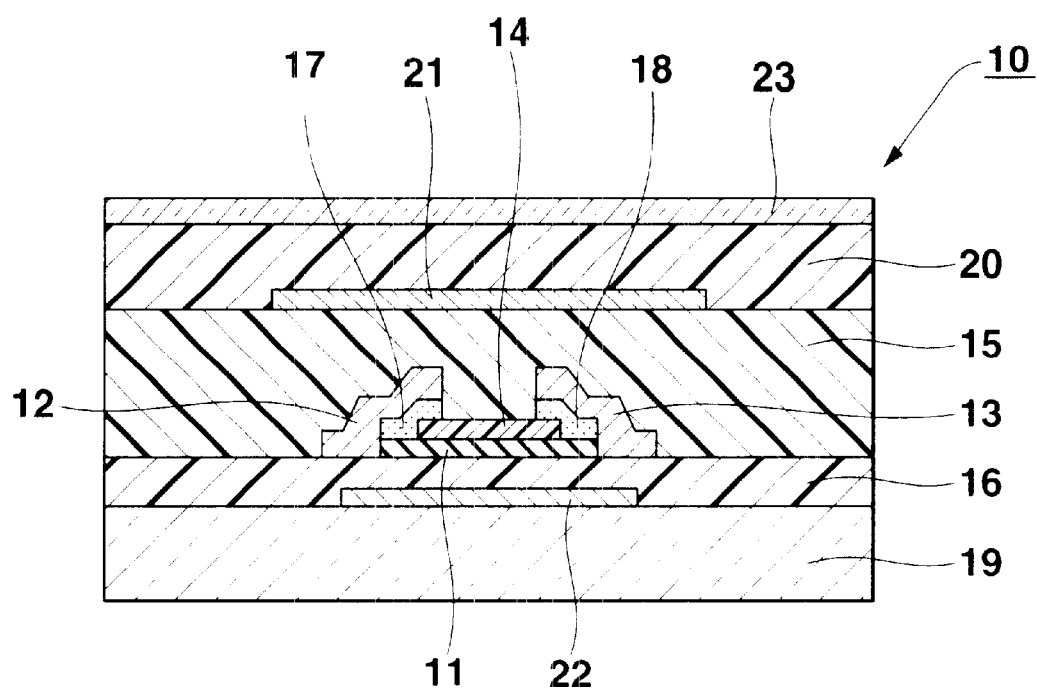
FIG. 1 is a cross sectional view schematically showing the basic construction of a double gate type photosensor used in an image reading apparatus according to one embodiment of the present invention.

FIG. 1 is a cross sectional view schematically showing the basic construction of the double gate type photosensor 10. As shown in FIG. 1, the double gate type photosensor 10 comprises a semiconductor layer (channel layer) 11 formed of, for example, an amorphous silicon and generating the electron-hole pairs upon receipt of a predetermined amount of an excited light, i.e., a visible light in this case, impurity doped layers 17, 18 formed of $n^+$-Si and arranged on both sides of the semiconductor layer 11, a drain electrode 12 and a source electrode 13 formed on the impurity doped layers 17 and 18, respectively, and made of a material selected from the group consisting of chromium, a chromium alloy, aluminum and an aluminum alloy, each of said drain electrode 12 and said source electrode 13 being opaque to a visible light, a block insulating film 14 formed on the semiconductor layer 11 and made of silicon nitride, a top or first gate insulating film 15 formed on the block insulating film 14 and made of silicon nitride, a top or second gate electrode 21 formed on the top gate insulating film 15 and made of a transparent conductive film such as an ITO film, said top gate electrode 21 transmitting a visible light, a bottom or first gate insulating film 16 formed below the semiconductor layer 11 and made of silicon nitride, and a bottom or first gate electrode 22 formed under the gate insulating film 16 and made of a material selected from the group consisting of chromium, a chromium alloy, aluminum and an aluminum alloy, said bottom gate electrode 22 being opaque to a visible light.

Further, a protective insulating film 20 made of silicon nitride is formed on the top gate insulating film and electrode 15, 21 of the double gate type photosensor 10, and a static electricity protection conductive layer 23 having of a transparent conductive layer such as an ITO layer is formed on the protective insulating film 20.

The static electricity protection conductive film 23 has a resistivity not higher than $2 \times 10^{-3}$ Ω·cm and a refractive index falling within a range of between about 2.0 and about 2.2. The thickness of the static electricity protection conductive layer 23 is determined to set the sheet resistance of the layer 23 at about 50 Ω/□ or less.

Each of the top gate insulating film 15, the block insulating film 14, the bottom gate insulating film 16, the protective insulating film and the static electricity protection conductive layer 23 shown in FIG. 1 is formed of a material having a high transmittance of a visible light serving to excite the semiconductor layer 11, e.g., silicon nitride or ITO, so as to permit the photosensor 10 to detect only the light incident from above in the drawing.

The double gate type photosensor 10 is of the structure that the sensor section and the MOS transistor section are formed integral and is formed on a transparent insulating substrate 19 such as a glass substrate. The sensor section includes the semiconductor layer 11 forming a region in which carrieres are generated upon receipt of light, the top gate insulating film 15, and the top gate electrode 21 to which is applied voltage for trapping the generated carrier of a predetermined polarity, e.g., hole. On the other hand, the MOS transistor section includes the semiconductor layer 11, the drain electrode 12, the source electrode 13 and the bottom electrode 22. In the MOS transistor of the particular construction, the drain current is caused to flow in accordance with the voltage applied to each of the drain electrode 12, the source electrode 13 and the bottom electrode 22 and the amount of the carrier trapped by the sensor section noted above.

Figure 2:
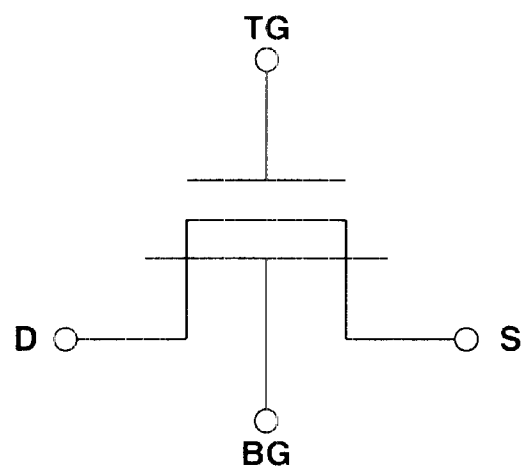
FIG. 2 is an equivalent circuit diagram of the double gate type photosensor shown in FIG. 1.

The double gate type photosensor 10 of the construction described above is represented in general by an equivalent circuit shown in FIG. 2. In the equivalent circuit shown in FIG. 2, TG denotes a top gate terminal, BG denotes a bottom gate terminal, S denotes a source terminal, and D denotes a drain terminal.

The photosensor system equipped with the photosensor array (photosensor device) formed by arranging the double gate type photosensors described above in a two dimensional direction will now be described briefly with reference to the accompanying drawings.

Figure 3:
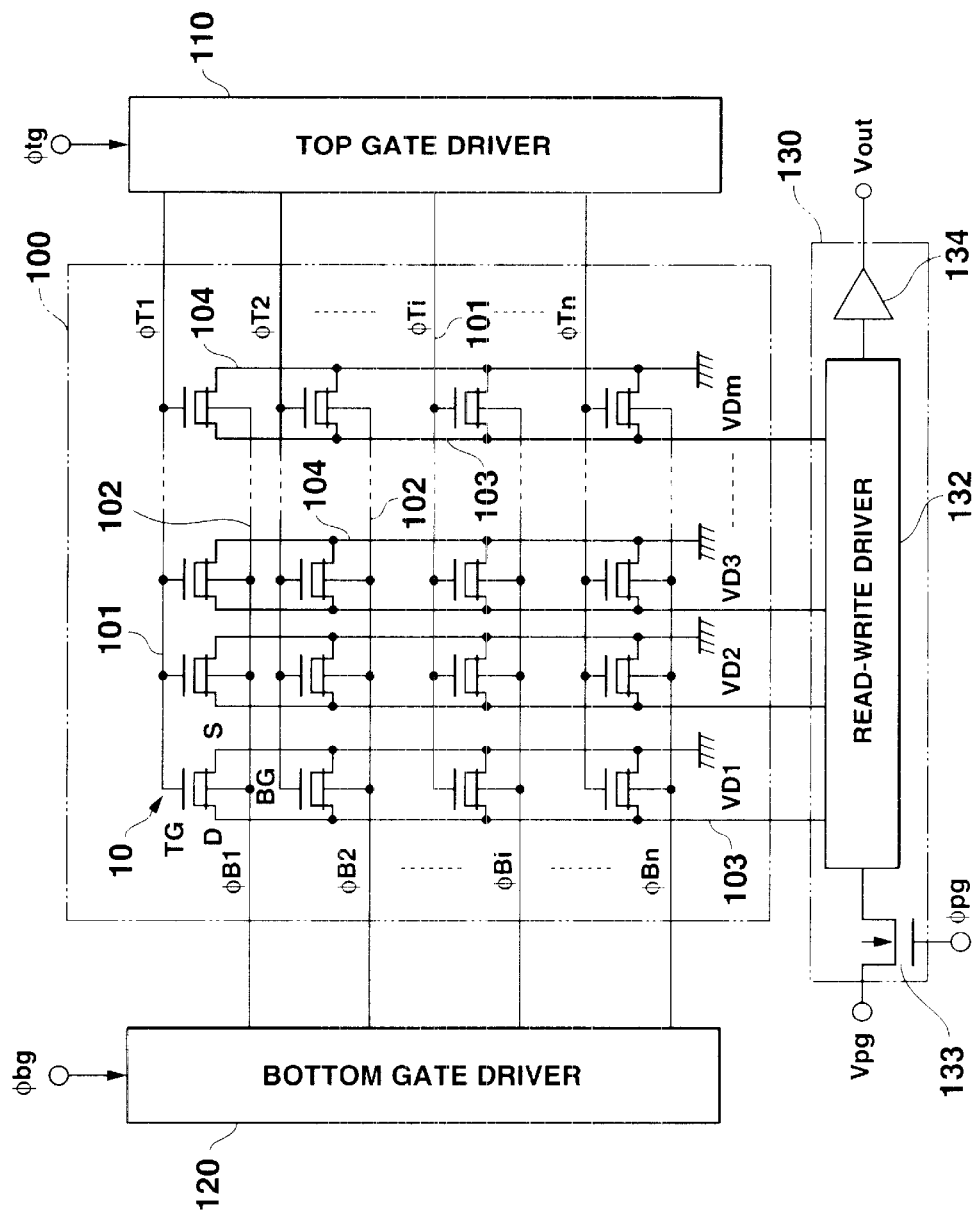
FIG. 3 is a view schematically showing the construction of a photosensor system equipped with a photosensor array prepared by arranging double gate type photosensors in a two dimensional direction.

FIG. 3 schematically shows the construction of the photosensor system equipped with the photosensor array formed by arranging the double gate type photosensors in a two dimensional direction or in matrix. As shown in FIG. 3, the photosensor system includes a photosensor array 100 formed by arranging a plurality of double gate type photosensors 10 in a matrix having n-rows and m-columns, top gate lines 101 each for allowing the top gate terminals TG (top gate electrodes 21) of a plurality of double gate type photosensors 10 positioned adjacent to each other in the row direction to be connected to each other, bottom gate lines 102 each for allowing the bottom gate terminals BG (bottom gate electrodes 22) of a plurality of double gate type photosensors 10 positioned adjacent to each other in the column direction to be connected to each other, drain lines 103 each for allowing the drain terminals D (drain electrodes 12) of the double gate type photosensors 10 to be connected to each other in the column direction, source lines 104 each for allowing the source terminals S (source electrodes 13) to be connected to each other in the column direction, a top gate driver 110 for supplying a predetermined signal to the top gate lines 101, a bottom gate driver 120 for supplying a predetermined signal to the bottom gate line 102s, and a drain driver (output circuit section) 130 including a read-write driver 132 for applying a predetermined voltage to the drain lines 103 and having voltage, which is changed in accordance with the light sense thereafter, applied thereto, a pre-charge switch 133 and an amplifier 134.

The top gate line 101 is formed integral with the top gate electrode 21 by a transparent conductive film such as an ITO film. The bottom gate line 102, the drain line 103 and the source line 104 are formed integral with the bottom gate electrode 22, the drain electrode 12 and the source electrode 13, respectively, by a material opaque to the same excited light. Also, the source line 104 is connected to the ground potential point.

Incidentally, the signal φtg represents a control signal for generating the reset pulse φT1, φT2, . . . φTi, . . . φTn. Also, the signal φbg represents a control signal for generating the read pulses φB1, φB2, . . . φBi, . . . φBn. Further, φpg represents a pre-charge signal for controlling the timing of applying a pre-charge voltage Vpg.

In the photosensor system of the construction shown in FIG. 3, the photosense function is realized by applying voltage from the top gate driver 110 to the top gate terminal TG through the top gate line 101, and voltage is applied from the bottom gate driver 112 to the bottom gate terminal BG through the bottom gate line 102 so as to take the detection signal into the drain driver 130 through the drain line 103, thereby generating an output signal (Vout) as a serial data or a parallel data and, thus, achieving the selective reading function.

The drive control method of the photosensor system described above will now be described with reference to the accompanying drawings.

Figure 4:
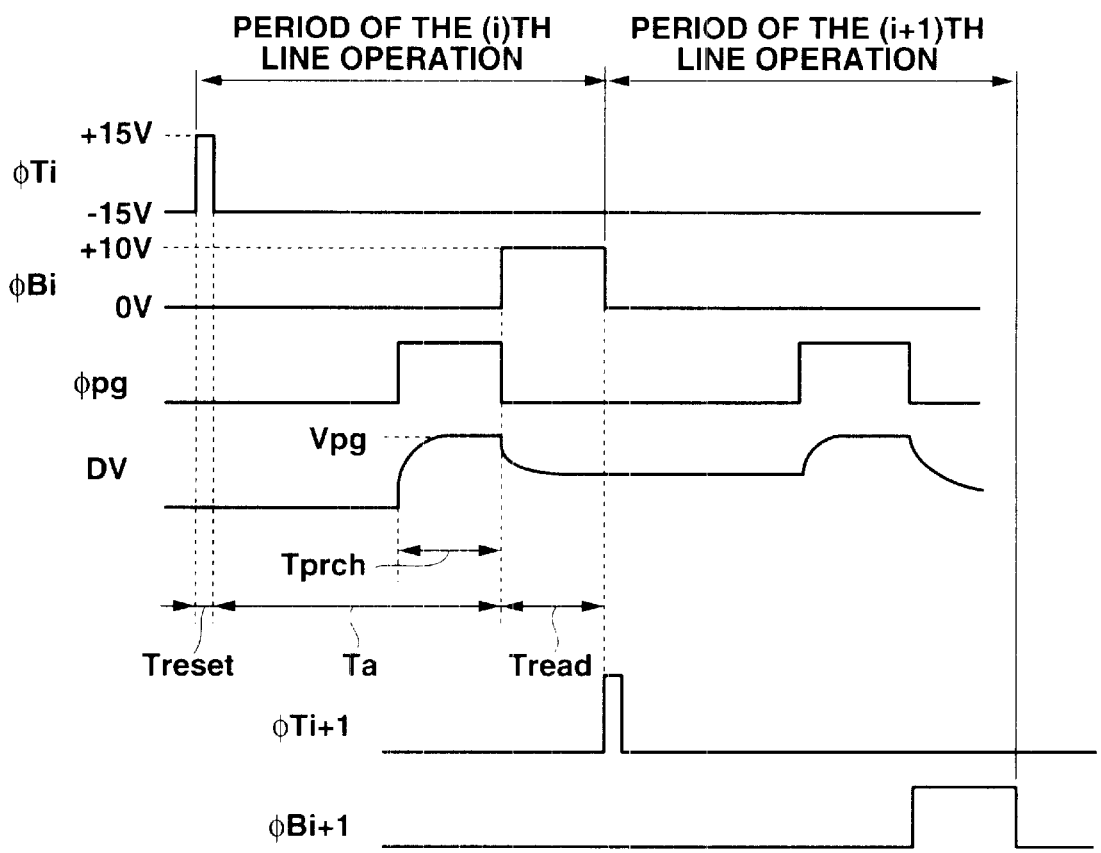
FIG. 4 is a timing chart exemplifying a drive control method of the photosensor system.

FIG. 4 is a timing chart exemplifying the drive control method of the photosensor system and schematically shows the concept of the double gate type photosensor. On the other hand, FIGS. 5 to 11 show the photo response characteristics of the output voltage of the photosensor system. In this case, the drive control method of the photosensor system will be described while referring appropriately to the construction of each of the double gate type photosensor and the photosensor system shown in FIGS. 1 and 3.

Figure 5:
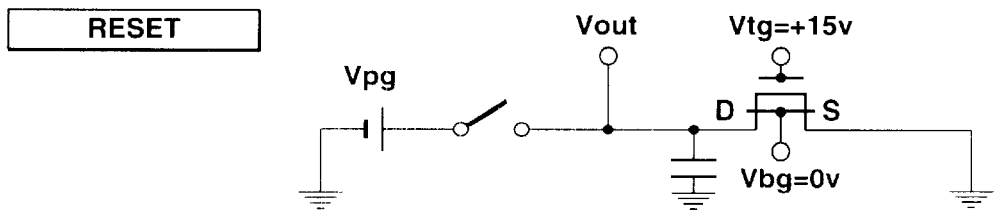
FIG. 5 is a view schematically showing the concept of the reset operation of the double gate type photosensor.

In the reset operation performed immediately before the photosense operation, a pulse voltage φTi ($1 \leq I \leq n$) (reset pulse of high level, e.g., Vtg=+15V) is applied to the top gate line 101 on the first row so as to release the carrieres, i.e., holes in this case, accumulated in the semiconductor layer 11 of each of the double gate type photosensors 10 and in the vicinity of the interface between the semiconductor layer 11 and the block insulating film 14, as shown in FIGS. 4 and 5 (reset period Treset).

Figure 6:
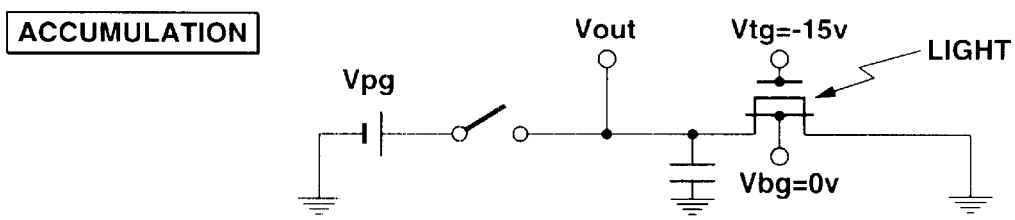
FIG. 6 is a view schematically showing the concept of the light carrier accumulating operation of the double gate type photosensor.

In the light accumulating operation after completion of the reset operation, a bias voltage φT1 of a low level, e.g., Vtg=−15V, is applied to the top gate line 101 so as to start the light accumulating period Ta for accumulating the carrier generated within the semiconductor layer 11 in accordance with receipt of light, as shown in FIGS. 4 and 6. To be more specific, in the light accumulating period Ta, electron-hole pairs are generated in the incident effective region of the semiconductor layer 11, i.e., the carrier generating region, in accordance with the amount of light incident from the side of the top gate electrode, with the result that the holes are accumulated in the semiconductor layer 11 and in the vicinity of the interface between the semiconductor layer 11 and the block insulating film 14, i.e., in the periphery of the channel region.

Figure 7:
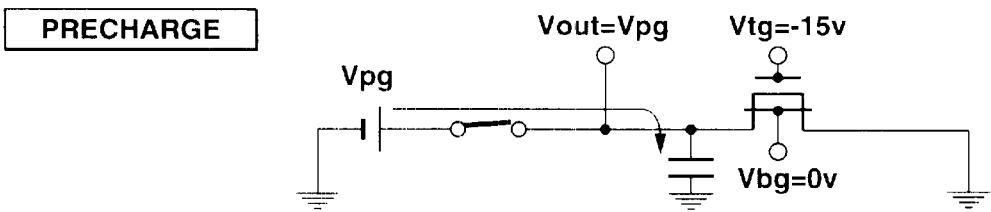
FIG. 7 is a view schematically showing the concept of the pre-charge operation to a drain line.

In the pre-charge operation, the read-write driver circuit 132 applies a predetermined voltage (pre-charge voltage) Vpg to the drain line 103 on the basis of the pre-charge signal φpg in parallel to the light accumulating period Ta, as shown in FIGS. 4 and 7, so as to allow the drain electrode 12 to retain voltage (pre-charge period Tprch).

Figure 8:
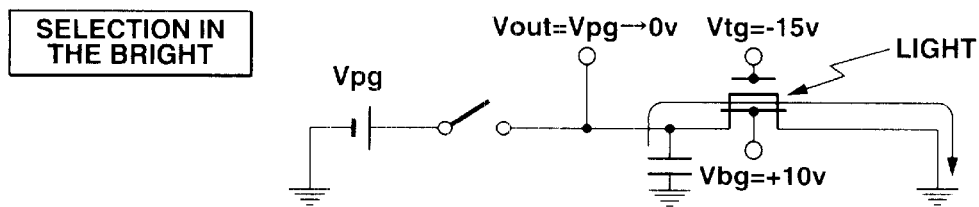
FIG. 8 is a view schematically showing the concept of the operation under a selection mode under a bright light environment.

In the next step, in the reading operation, a bias voltage φBi (i.e., a read selection signal, which is hereinafter referred to as "read pulse") of a high level, e.g., Vbg=+10V, is applied to the bottom gate line 102 after the pre-charge period Tprch so as to turn on the double gate type photosensor 10 (read period Tread) as shown in FIGS. 4 and 8.

In this case, if a sufficient amount of holes are accumulated in the vicinity of the channel region in the light accumulating period Ta, the accumulated holes are allowed to perform their function in the direction of alleviating the influence of the electric field generated by the voltage Vtg (−15V) applied to the top gate terminal TG of the relatively opposite polarity, with the result that an n-channel is formed by the voltage Vbg (+10V) applied to the bottom gate terminal BG. It should be noted that the drain line voltage VD of the drain line 103 tends to be gradually lowered with lapse of time from the pre-charge voltage Vpg in accordance with the drain current flowing in accordance with the channel formation, as shown in FIG. 12.

Figure 12:
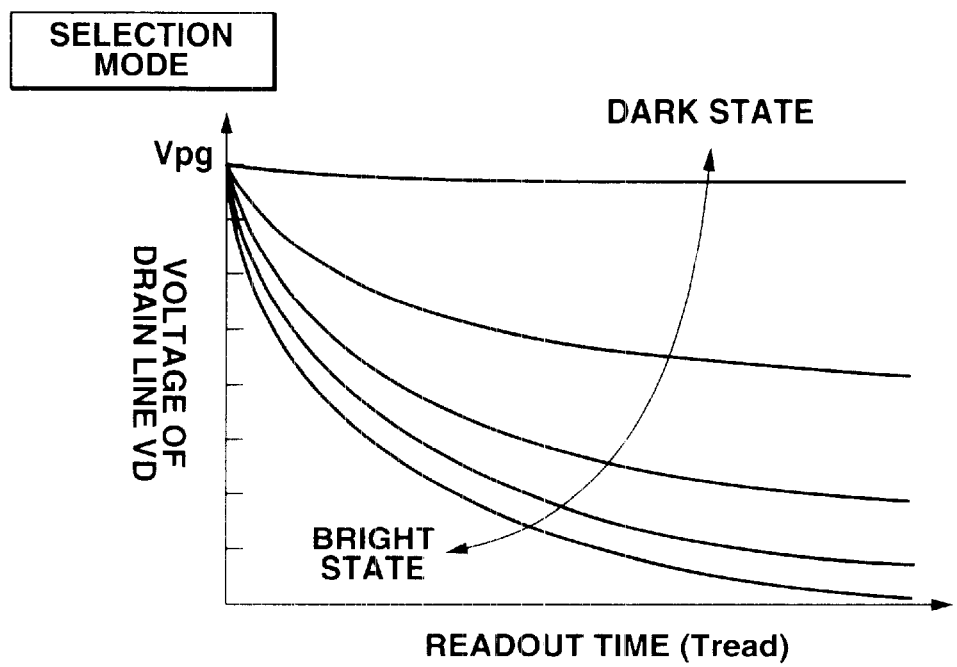
FIG. 12 is a graph showing the light response characteristics of the output voltage under the selection mode of the photosensor system.
Figure 13:
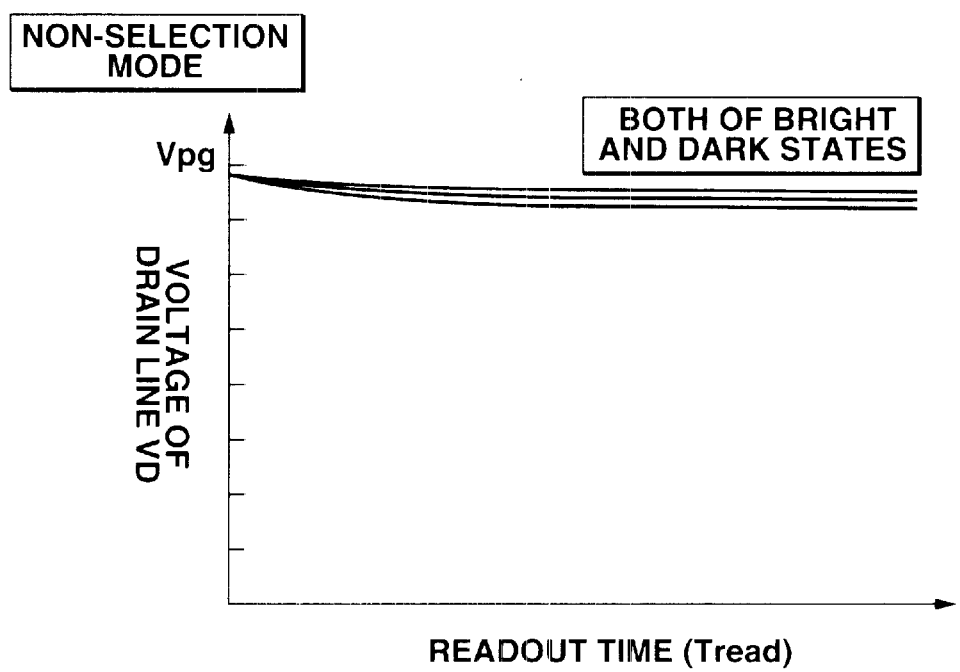
FIG. 13 is a graph showing the light response characteristics of the output voltage under the non-selection mode of the photosensor system.

To be more specific, where the light accumulated state is under a bright state, the holes are trapped in accordance with the amount of light incident on the channel region as shown in FIGS. 8 and 12 so as to cancel the negative bias of the top gate terminal TG, and the double gate type photosensor 10 is turned on by the positive bias of the bottom gate terminal BG in accordance with cancellation of the negative bias noted above. It follows that the voltage VD of the drain line 103 is lowered in accordance with the ON resistance conforming with the amount of the incident light.

Figure 9:
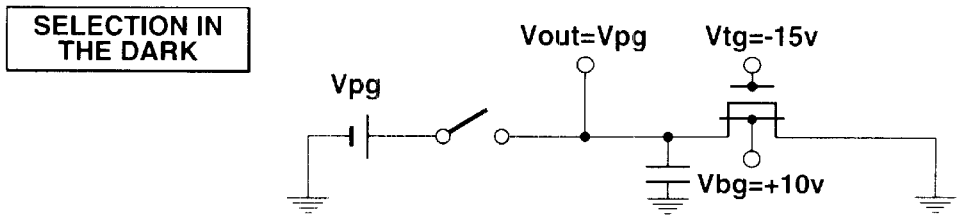
FIG. 9 is a view schematically showing the concept of the operation under a selection mode under a dark light environment.

On the other hand, where any carrier (hole) is not accumulated in the channel region under the dark state of the light accumulated state during the light accumulating period Ta, the positive bias voltage Vbg (+10V) of the bottom gate terminal BG is canceled by application of a negative bias to the top gate terminal TG, as shown in FIGS. 9 and 12, resulting in failure for the double gate type photosensor 10 to form a channel. It follows that the drain voltage, i.e., the voltage VD of the drain line 103, is retained as it is.

Under the circumstances, the tendency of the change in the voltage VD of the drain line 103 is deeply related to the amount of the received light during the period (light accumulating period Ta) between the completion time of the reset operation by the application of the reset pulse φTi to the top gate terminal TG and the time when the read pulse φB1 is applied to the bottom gate terminal BG. Specifically, where the amount of the accumulated carrier is small, the voltage VD of the drain line 103 tends to be lowered moderately. Also, the voltage VD of the drain line 103 tends to be lowered rapidly where the amount of the accumulated charge is large. It follows that the amount of the irradiating light can be detected by detecting the voltage VD of the drain line 103 a predetermined time later or by detecting the time to reach the voltage VD on the basis of a predetermined threshold voltage.

It is possible to allow the double gate type photosensor 10 to operate as a two dimensional sensor system by repeatedly applying the same treating procedure to the double gate type photosensor on the (1+1)st row, too, with a series of the image reading operations described above forming one cycle.

Figure 10:
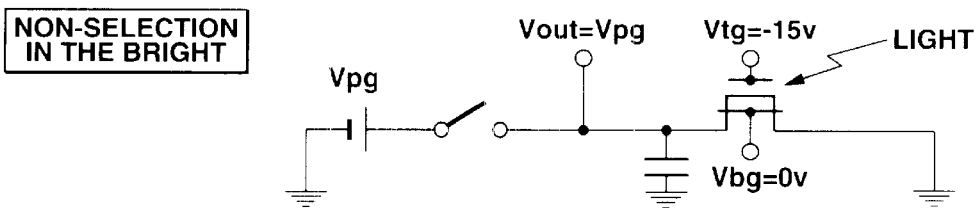
FIG. 10 is a view schematically showing the concept of the operation under a non-selection mode under a bright light environment.
Figure 11:
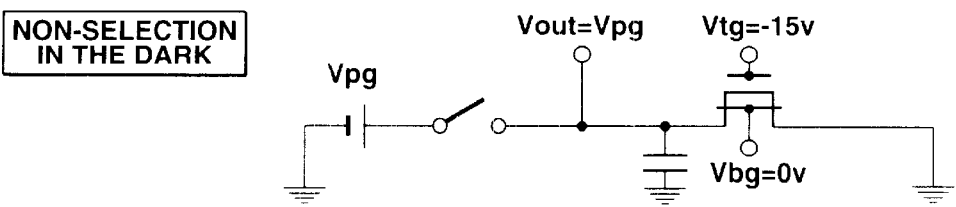
FIG. 11 is a view schematically showing the concept of the operation under a non-selection mode under a dark light environment.

Incidentally, in the timing chart shown in FIG. 4, if the state of applying the low level voltage Vbg (0V) to the bottom gate line 102 is continued after the lapse of the pre-charge period Tprch, as shown in FIGS. 10 and 11, the double gate type photosensor 10 maintains the OFF state regardless of the presence or absence of the incident light, with the result that the voltage VD of the drain line 103 holds the pre-charge voltage Vpg. In this fashion, the selecting function for selecting the read state of the double gate type photosensor 10 can be realized by the applied state of voltage to the bottom gate line 102.

Figure 14:
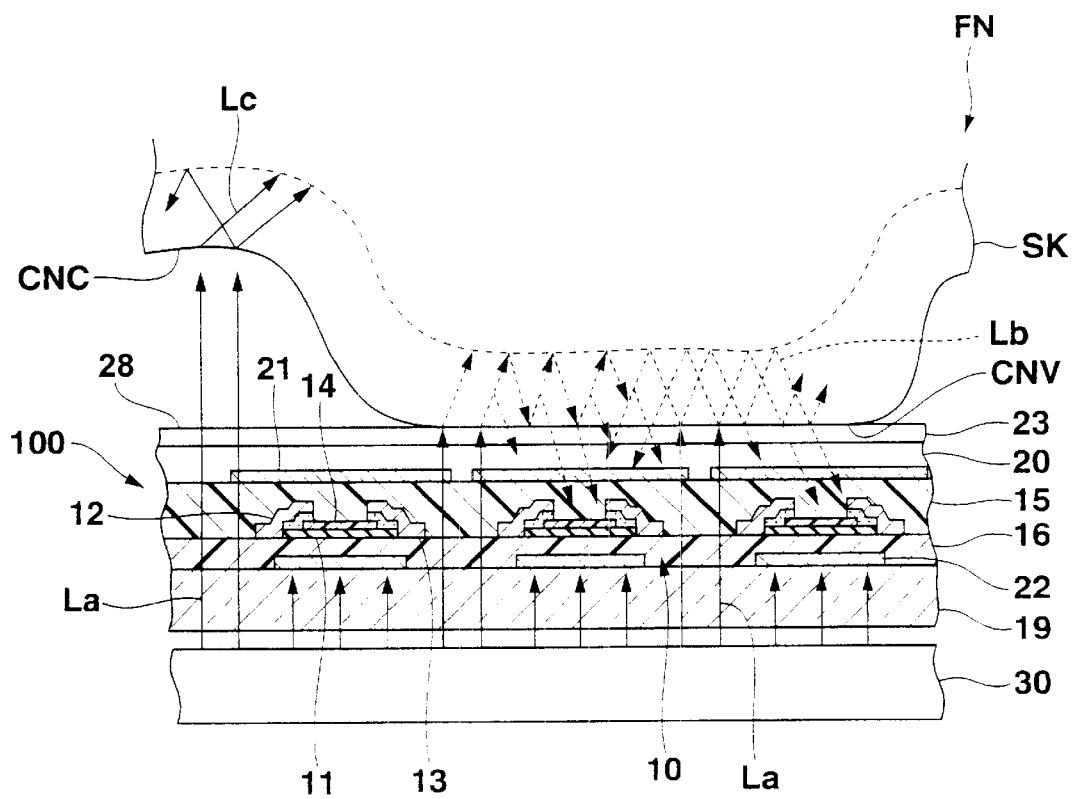
FIG. 14 is a view schematically showing the concept of the incident state of light for recognizing the image conforming with the irregularity of a finger by a photosensor system equipped with a double gate type photosensor.

FIG. 14 is a cross sectional view showing a gist portion of a two dimensional image reading apparatus (fingerprint reading apparatus) to which is applied the photosensor system described above. In this case, the hatching denoting the cross sectional portion of the photosensor system is omitted for clarifying the description and simplifying the drawing.

As shown in FIG. 14, in the image reading apparatus for reading a two dimensional image such as a fingerprint, a back light system 30 including a fluorescent tube, an optical guide plate and a diffusion plate and providing a planar light source is arranged below the glass substrate (insulating substrate) 19 on which are formed the double gate type photosensors 10. The irradiating light La emitted from the back light system 30 passes through the transparent insulating substrate 19 and the insulating films 15, 16, 20 except the forming region of the double gate type photosensor 10, i.e., the bottom gate electrode 22, the drain gate 12 and the source gate 13, so as to irradiate a finger (target object) FN disposed on a target contact surface 28 on the transparent static electricity protection conductive layer 23.

In detecting the fingerprint by the fingerprint reading apparatus, the translucent layer of the skin surface layer SK of the finger FN is brought into contact with the static electricity protection conductive layer 23 constituting the uppermost surface layer of the photosensor array 100 so as to eliminate an air layer having a low refractive index from the interface between the static electricity protection conductive layer 23 and the skin surface layer SK. Since the skin surface layer SK is thicker than 650 nm, the light La incident on the inner portion in the convex portion CNV of the finger FN is propagated within the skin surface layer SK while being scattered and reflected. A part of the propagated light Lb passes through the static electricity protection conductive layer 23, the transparent insulating films 20, 15, 14 and the top gate electrode 21 so as to be incident as an excited light on the semiconductor layer 11 of the double gate type photosensor 10. The carriers (holes) formed by the light incident on the semiconductor layer 11 of the double gate type photosensor 10 arranged in the position corresponding to the convex portion CNV of the finger FN are accumulated so as to make it possible to read the image pattern of the finger FN as a bright-dark information in accordance with the series of drive control method described above.

In the concave portion CNC of the finger FN, the irradiating light La passes through the interface between the fingerprint detecting surface 28 of the static electricity protection conductive layer 23 and the air layer so as to arrive at the finger ahead of the air layer and, thus, to be scattered within the skin surface layer SK. However, since the refractive index of the skin surface layer SK of the finger FN is higher than that of the air, the light Lc within the skin surface layer SK, which is incident on the interface at a certain angle, is unlikely to pass through the air layer so as to suppress the incidence of the light Lc on the semiconductor layer 11 of the double gate type photosensor 10 arranged in the position corresponding to the concave portion CNC.

The embodiment of the present invention described below is directed to the case where the double gate type photosensor is applied as the photosensor. However, the present invention is not limited to this case. Needless to say, it is also possible to apply effectively a photodiode, a TFT, etc. to the two dimensional image reading apparatus of the present invention.

A specific embodiment will now be described in respect of the two dimensional image reading apparatus of the present invention. In the embodiment described below, the double gate type photosensor is used as the photosensor.

Figure 15:
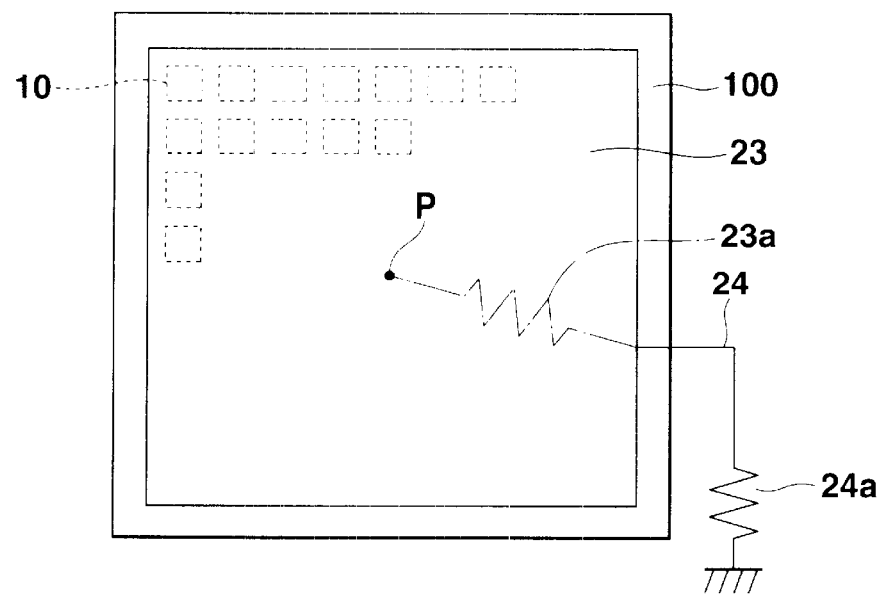
FIG. 15 is a view schematically showing the concept of the resistance distribution of the photosensor system equipped with a double gate type photosensor.
Figure 16:
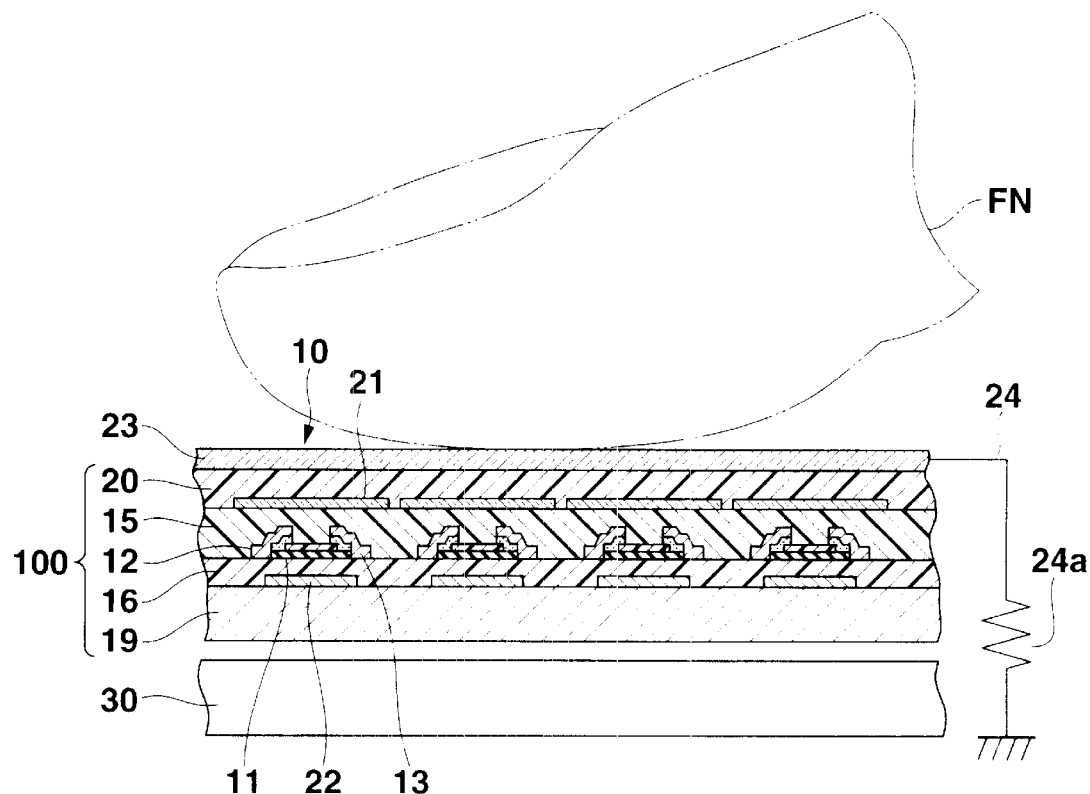
FIG. 16 is a cross sectional view showing a portion of the photosensor system, in which the static electricity charged in a finger is released.

FIG. 15 is a plan view showing the resistance of the two dimensional image reading apparatus of the present invention. FIG. 16 schematically shows the construction of the two dimensional image reading apparatus according to one embodiment of the present invention, covering the case where the two dimensional image reading apparatus of the present invention is applied to a fingerprint reading apparatus. Incidentally, the constituents of the two dimensional image reading apparatus common with FIGS. 1 and 14 are denoted by the same reference numerals so as to avoid an overlapping description.

As shown in FIGS. 15 and 16, the two dimensional image reading apparatus according to the embodiment of the present invention comprises a photosensor array (photosensor device) 100 prepared by arranging a plurality of double gate type photosensors 10 of the construction described above on a glass substrate 19 to form a matrix, a static electricity protection conductive layer 23 formed on the upper surface of a light transmitting protective insulating film 20 formed to cover the entire surface of the array region in which at least a plurality of the double gate type photosensors 10 are arranged, a drawing wiring 24 serving to connect the static electricity protection conductive layer 23 to the ground potential point, and a back light system 30 arranged on the side of the back surface (lower portion in the drawing) of the photosensor array 100 so as to irradiate the finger (target object to be detected) FN, which is brought into contact with the upper side of the photosensor array 100, i.e., with the upper surface of the static electricity protection conductive layer 23, with a uniform light. A point P shown in FIG. 15 denotes a position on the static electricity protection conductive layer 23 at which arrives the static electricity released from an electrostatic gun described herein later. A resistance 23a denotes the resistance of the static electricity protection conductive layer 23 in the region between the point P and the wiring 24. Resistance 24a denotes the resistance of the drawing wire 24.

The static electricity protection conductive layer 23 formed on the upper surface of the protective insulating film 20 is formed of a conductive film having a high transmittance of a visible light serving to excite the semiconductor layer 11 of each of the double gate type photosensors 10. For example, the static electricity protection conductive layer 23 is formed of a material selected from the group consisting of ITO, tin oxide ($SnO_2$), and oxides of indium and zinc. The thickness of the static electricity protection conductive layer 23 is determined to allow the conductive layer 23 to exhibit a sheet resistance not higher than about 50 Ω/□.

It should be noted that the transmittance of the excited light is lowered with increase in the thickness of the static electricity protection conductive layer 23. Therefore, it is desirable for the static electricity protection conductive layer 23 to be formed of a material having a resistivity not higher than $2 \times 10^{-3}$ Ω·cm in order to achieve the range of the sheet resistance noted above. Also, in order to prevent the light from being reflected and dispersed at the interface with the protective insulating film 20 and to prevent the light amount reaching the finger FN from being attenuated, it is desirable for the static electricity protection conductive layer 23 to be formed of a material having a refractive index not smaller than the refractive index (about 1.8 to 2.0) of silicon nitride forming the protective insulating film 20.

On the other hand, the drawing wiring 24, which serves to connect the static electricity protection conductive wire 23 to the ground potential point, is formed of a wiring material having a low resistivity so as to release satisfactorily the static electricity charged in the finger FN (or the human body) in contact with the static electricity protection conductive layer 23. To be more specific, the drawing wire 24 is formed of a lead wire or a metal layer. The cross sectional area, etc. of the drawing wire 24 is determined to allow the wiring resistance 24a to be about 30 Ω or less.

If the target object to be detected, i.e., the finger FN, is disposed on or is brought into contact with the static electricity protection conductive layer 23 in the two dimensional image reading apparatus of the construction described above, the static electricity charged in the finger FN (or the human body) is migrated from the static electricity protection conductive layer 23 having a low sheet resistance into the drawing wire 24 having a lower resistivity so as to be released into the ground potential point. Since the static electricity charged in the finger FN can be released sufficiently and without fail as described above, it is possible to improve the resistance to the static electricity of the photosensor array 100, thereby markedly suppressing the malfunction of reading of the two dimensional image reading apparatus (fingerprint reading apparatus) and the breakage of the photosensor array 100, which are caused by the static electricity noted above.

According to the two dimensional image reading apparatus of the embodiment described above, the static electricity protection conductive layer 23 is formed of a transparent conductive material having a predetermined range of the refractive index such as ITO, with the result that the light irradiating the finger FN disposed on the static electricity protection conductive layer 23 and reflected from the finger FN is incident satisfactorily on the semiconductor layer 11 of each of the double gate type photosensors 10. It follows that the read sensitivity characteristics in the reading operation of the finger FN (target object) are not rendered poor, making it possible to read the image pattern (fingerprint) of the target object satisfactorily.

The static electricity protection conductive layer 23 and the drawing wiring 24 included in the two dimensional image reading apparatus according to the embodiment of the present invention will now be described more in detail.

As described previously, the sheet resistance of the static electricity protection conductive layer 23 used in the apparatus according to the first embodiment of the present invention is set at 50 Ω/□ or less. Also, the wiring resistance 24a is set at 30 Ω or less. Let us describe the relationship between the sheet resistance of the ITO layer constituting the static electricity protection conductive layer 23 and the line resistance of the lead wire or the withstand voltage of the photosensor array in respect of an experimental model in which the ITO layer noted above is connected to the ground potential point via the lead wire.

Figure 17:
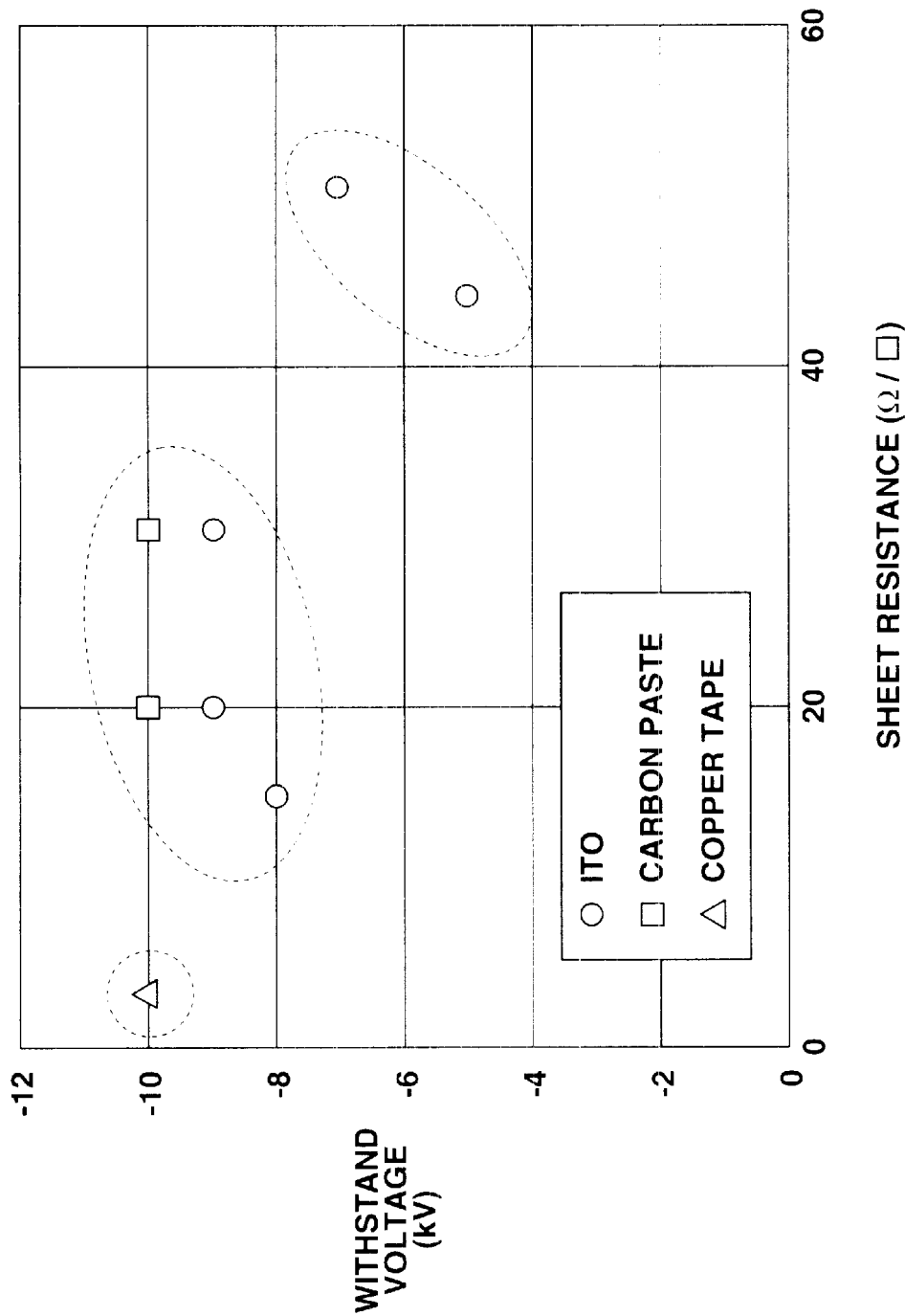
FIG. 17 is a view illustrating the experimental data showing the relationship between the sheet resistance and the withstand voltage of the ITO layer used as a conductive layer for protection against the static electricity according to one embodiment of the present invention.

FIG. 17 shows the experimental data on the relationship between the sheet resistance of the ITO layer, which constitutes the static electricity protection conductive layer used in the apparatus according to the embodiment of the present invention, and the withstand voltage of the photosensor array. FIG. 18 shows the experimental data on the withstand voltage relative to the thickness of the static electricity protection conductive layer 23 of the photosensor array 100 used exclusively for reading the fingerprint, said photosensor array 100 including the static electricity protection conductive layer 23 having an area substantially equal to the tip portion of a finger. Further, FIG. 19 shows the experimental data on the withstand voltage relative to the ground voltage of the static electricity protection conductive layer 23 of the photosensor array 100 used exclusively for reading a fingerprint, said static electricity protection conductive layer 23 having an area substantially equal to the area of the tip portion of a finger. For determining the withstand voltage, an electric field of a high intensity is generated on the static electricity protection conductive layer 23 by using an electrostatic gun, and the voltage when a part or all of the circuits shown in FIG. 3 fail to perform the normal functions is defined as the withstand voltage. The grounding resistance can be decomposed into the resistance 23a between the static electricity protection conductive layer 23 and the ground potential point and the line resistance 24a of the drawing wire 24, which is added as required. In FIG. 18, the line resistance 24a is added in accordance with the resistance 23a that is changed in accordance with the thickness of the static electricity protection conductive layer 23 so as to set the ground potential (grounding resistance) at about 35 to 37 Ω. Incidentally, the manufacturing apparatus used for manufacturing the photosensor array 100 shown in FIG. 18 differs from the manufacturing apparatus used for manufacturing the photosensor array 100 shown in FIG. 19. As a result, the characteristics of the photosensor arrays 100 shown in FIGS. 18 and 19 are not necessarily equal completely to each other.

Figure 20:
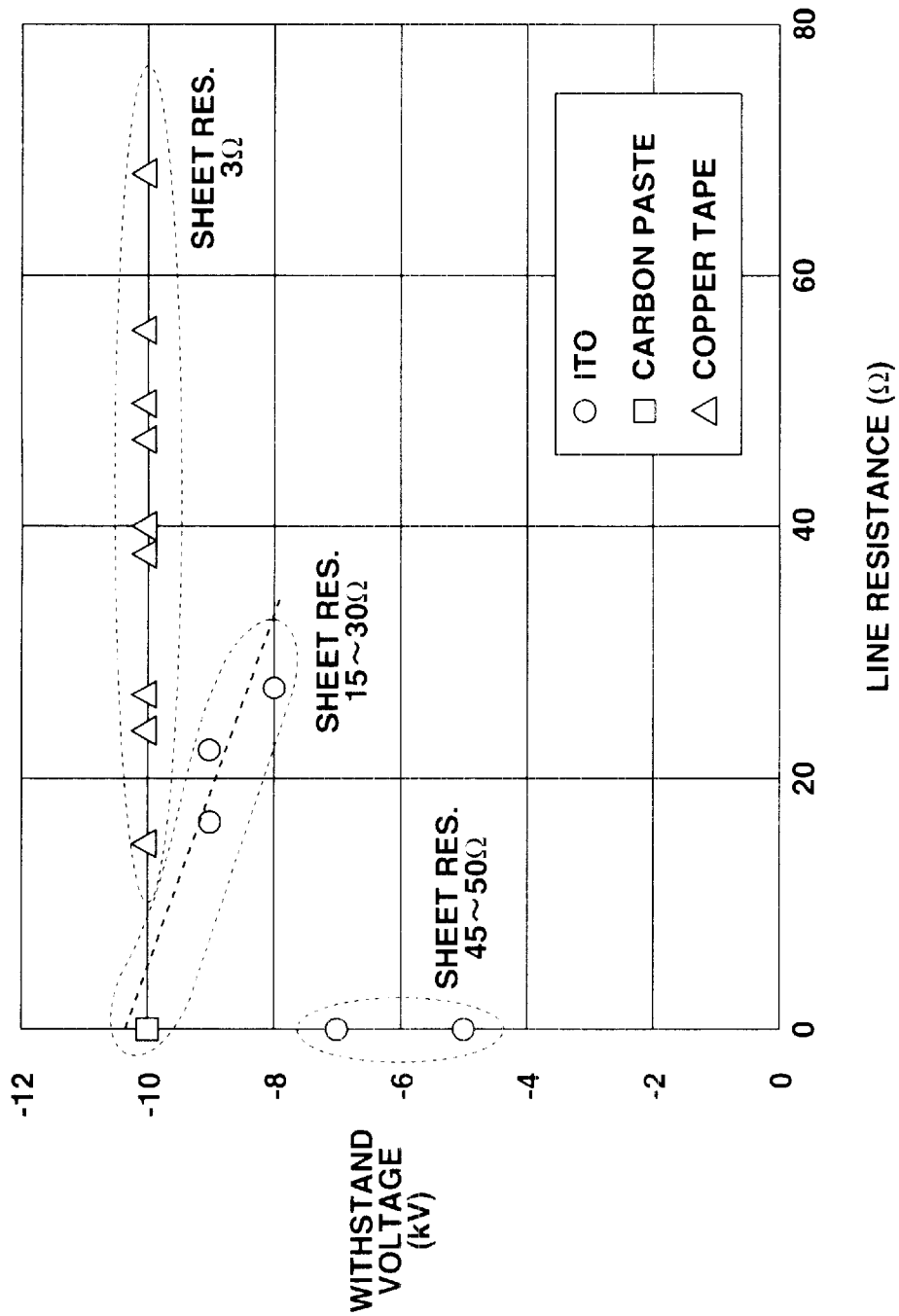
FIG. 20 is a view for illustrating the experimental data showing the relationship between the line resistance and the withstand voltage of the drawing wiring according to the embodiment of the present invention.
Figure 21:
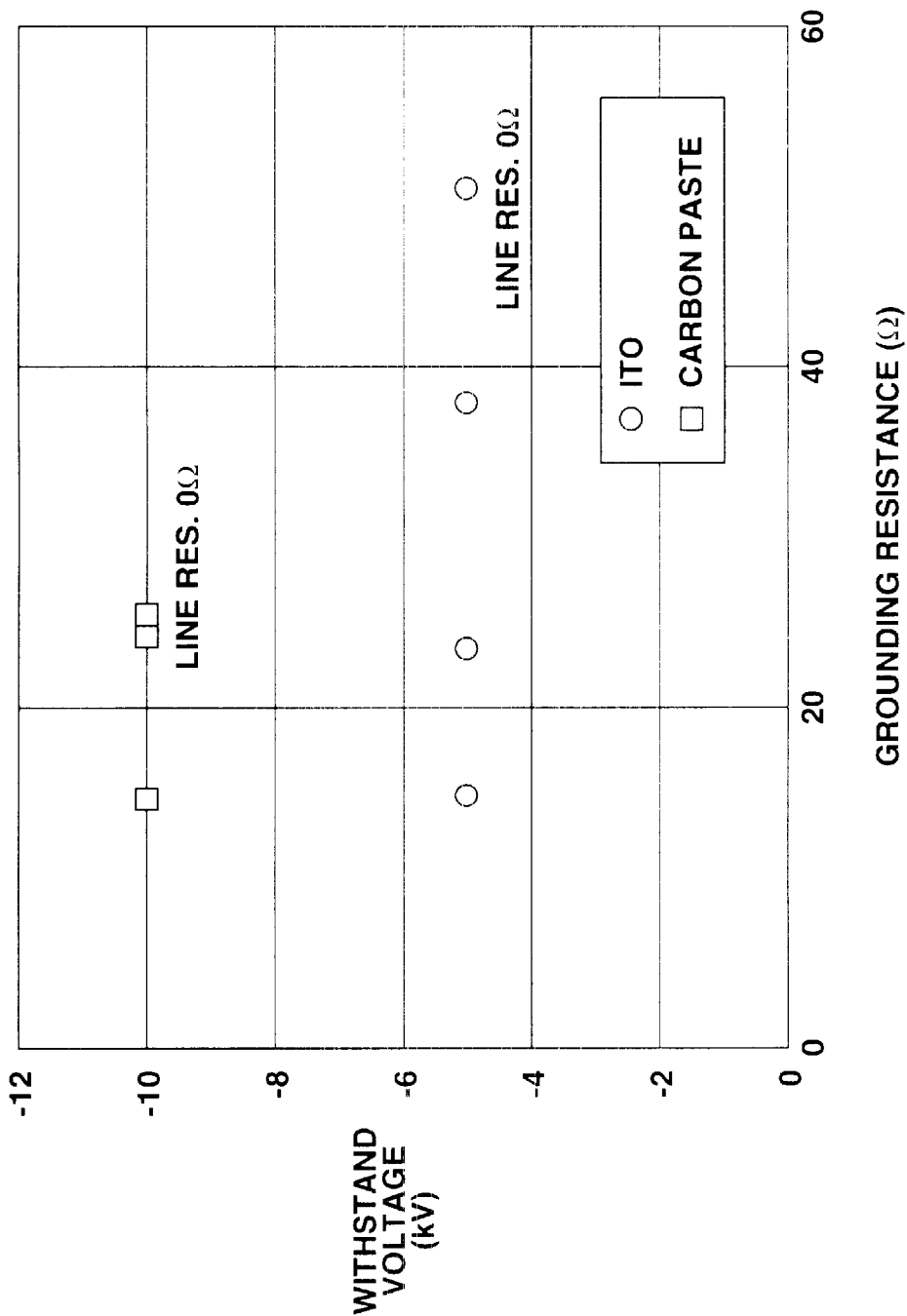
FIG. 21 is a view for illustrating the experimental data showing the relationship between the grounding resistance and the withstand voltage in releasing the charge to the ground potential according to the embodiment of the present invention.
Figure 22:
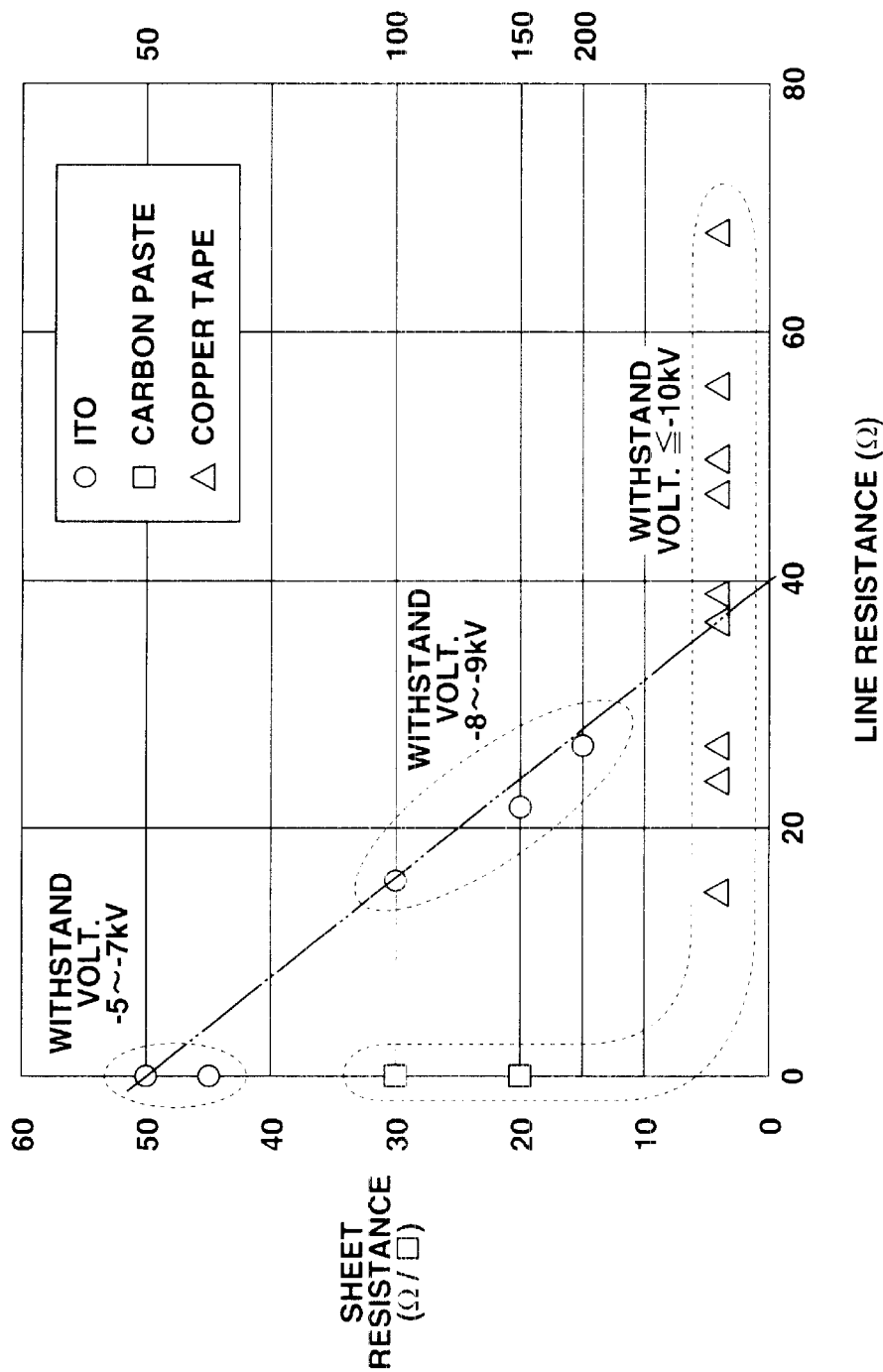
FIG. 22 is a view for illustrating the experimental data showing the relationship between the sheet resistance of the ITO layer used as a static electricity protection conductive layer and the line resistance of the withdrawing wire according to the embodiment of the present invention.

FIG. 20 shows the experimental data on the relationship between the line resistance of the drawing wire and the withstand voltage in respect of the apparatus according to the first embodiment of the present invention. FIG. 21 shows the experimental data on the relationship between the grounding resistance and the withstand voltage in respect of the apparatus according to the first embodiment of the present invention. Further, FIG. 22 shows the experimental data on the relationship between the sheet resistance of the ITO layer used as the static electricity protection conductive layer in the apparatus according to the first embodiment of the present invention and the line resistance. The drawing wiring 24 is added to the photosensor array 100 shown in FIG. 17, in which ITO is used for forming the static electricity protection conductive layer 23, so as to allow the grounding resistance in every point between the point P of the static electricity protection conductive layer 23 and the ground potential point to fall within a range of between 35 Ω and 37 Ω, as shown in FIG. 18. Similarly, in the case of the ITO layer having the sheet resistance shown in FIG. 20 falling within a range of between 15 Ω and 30 Ω, the grounding resistance was made uniform to fall within a range of between 35 Ω and 37 Ω. It is possible to control the sheet resistance of the ITO film by changing the thickness, the oxygen content, etc. of the ITO layer.

<Relationship Between Sheet Resistance and Withstand Voltage>

It has been observed in respect of the relationship between the sheet resistance and the withstand voltage in the case of using an ITO layer as the static electricity protection conductive layer that the absolute value of the withstand voltage tends to be lowered (−5 to −7 kV) with increase in the sheet resistance (45 to 50 Ω/□), and that the absolute value of the withstand voltage tends to be increased (−8 to −9 kV) with decrease in the sheet resistance (15 to 30 Ω/□).

Incidentally, the measuring apparatus is incapable of measuring the withstand voltage lower than the lowest value of −10 kV. Therefore, comparison with another material was conducted under the same experimental conditions. It has been found that, where a carbon paste or a copper tape having a relatively low sheet resistance was used for forming the static electricity protection conductive layer, the withstand voltage was found to be lowered to −10 kV. However, the withstand voltage was substantially lower than −10 kV. Since the absolute value of the withstand voltage is larger than 10 kV, it has been found that, if the sheet resistance is sufficiently low, the absolute value of the withstand voltage is increased. Incidentally, since the absolute value of the discharge voltage by the contact with a finger is about 3 to 4 kV, a satisfactory function can be obtained if the absolute value is larger than 5 kV.

FIG. 18 shows the relationship between the thickness of the ITO sheet forming the static electricity protection conductive layer 23 of the photosensor array 100 use exclusively for reading a fingerprint and the sheet resistance. As apparent from FIG. 18, in order to set the sheet resistance at a low level of about 15 to 20 Ω/□ for increasing the withstand voltage as pointed out above, it is necessary to form the ITO film in a thickness of about 150 to 200 nm. It should be noted that the ITO layer is formed of a transparent conductive material. If the thickness of the ITO layer is increased unconditionally in order to realize a low sheet resistance, the light attenuation takes place even within the ITO layer because of the absorption and scattering of the light so as to render poor the read sensitivity characteristics of the image pattern of the target object. Also, the film formation takes a long time so as to lower the productivity. Further, the transmittance of ITO per unit thickness can be increased by controlling the oxygen content of the ITO layer. However, if the oxygen content of the ITO layer is controlled, the resistivity of the ITO layer is increased. Under the circumstances, it is reasonable to use ITO having a resistivity not higher than $2 \times 10^{-3}$ Ω·cm and a refractive index falling within a range of between about 2.0 and 2.2 and to set the thickness of the ITO layer at about 50 to 200 nm so as to allow the ITO layer to exhibit a sheet resistance of 15 to 50 Ω/□. Where the first priority is put on the productivity, it is desirable to set the thickness of the ITO layer at about 50 to 100 nm so as to allow the ITO layer to exhibit a sheet resistance of 30 to 50 Ω/□. On the other hand, where the first priority is put on the discharge characteristics due to the sheet resistance, it is desirable to set the thickness of the ITO layer at about 150 to 200 nm so as to allow the ITO layer to exhibit a sheet resistance of 15 to 20 Ω/□.

<Relationship Between Line Resistance and Withstand Voltage>

FIG. 20 shows the relationship between the line resistance 24a added as a part of the grounding resistance and the withstand voltage. As shown in FIG. 20, where the sheet resistance of the static electricity protection conductive layer 23 is very low, i.e., about 3 Ω/□, the withstand voltage is scarcely affected by the line resistance so as to be maintained substantially constant when the grounding resistance falls within a range between 15 Ω and 68 Ω. To be more specific, the absolute value of the withstand voltage is very large, i.e., −10 kV or lower. Where the static electricity protection conductive layer 23 exhibits a high sheet resistance of 45 to 50 Ω/□, the absolute value of the withstand voltage is low, i.e., about −5 to −7 kV, even if the line resistance 24a is 0 Ω. It follows that the withstand voltage is markedly affected by the sheet resistance. Also, where the static electricity protection conductive layer 23 exhibits an intermediate sheet resistance, i.e., 15 to 30 Ω/□, the absolute value of the withstand voltage tends to be rendered high (not lower than −9 kV) with decrease in the line resistance, and the absolute value of the withstand voltage tends to be lowered (not higher than −8 kV) with increase in the line resistance in spite of the grounding resistance that is held substantially constant.

As described above, it has been found that, where the sheet resistance is very low, i.e., about 3 Ω/□, the influence by the line resistance is scarcely recognized. Where the sheet resistance is intermediate, i.e., 20 to 30 Ω/□, the line resistance produces some influence, though the influence produced by the sheet resistance is larger than the influence produced by the line resistance. Further, it has been found that, where the sheet resistance is high, i.e., 45 to 50 Ω/□, the withstand voltage is markedly affected by the sheet resistance, though the withstand voltage is scarcely affected by the line resistance. In other words, where the sheet resistance falls within a range of between 3 and 50 Ω/□, the withstand voltage is more affected by the sheet resistance than by the line resistance. This tendency is rendered prominent particularly where the sheet resistance is low.

<Relationship Between Grounding Resistance and Withstand Voltage>

FIG. 19 shows the relationship between the grounding resistance and the withstand voltage in respect of the photosensor array 100, covering the case where an ITO layer having a sheet resistance of 45 Ω/□ was used as the static electricity protection conductive layer, and the drawing wire 24 between the terminal of the resistance 23a and the ground potential point was not arranged so as to set the line resistance 24a at zero. As apparent from FIG. 21, a remarkable influence given to the withstand voltage was not recognized even if the line resistance 24a was set at zero and the grounding resistance was shifted. Incidentally, in the case of using a carbon paste for forming the static electricity protection conductive layer, the sheet resistance was about 20 to 30 Ω/□ in any case.

<Relationship Between Sheet Resistance and Line Resistance>

FIG. 22 shows the relationship between the sheet resistance and the line resistance. As shown in FIG. 22, if the sheet resistance is 3 Ω/□, the withstand voltage is kept not higher than −10 kV regardless of the line resistance in the case where the line resistance falls within a range of between 15 Ω and 50 Ω. Likewise, it has been found that the withstand voltage is not higher than about −10 kV if the line resistance is zero, even if the sheet resistance is 20 to 30 Ω/□. Also, the withstand voltage is −8 to −9 kV when it comes to the photosensor array 100 in which the sheet resistance is set at 15 to 30 Ω/□ and the grounding resistance is set at about 36 Ω by setting the line resistance at 16 to 27 Ω. Further, the withstand voltage was about −5 to −7 kV when it comes to the photosensor array 100 in which the sheet resistance was set at 45 to 50 Ω/□ and the line resistance was set at zero.

To be more specific, if the sheet resistance is set at 45 to 50 Ω/□ by putting the first priority on the productivity of the photosensor array 100, the sheet resistance falls within an allowable range in which the static electricity accumulated in general in the human body is released to the ground. If the priority is put equally on both the productivity of the photosensor array 100 and the withstand voltage, it is possible to obtain a sufficient withstand voltage by setting the sheet resistance at 15 to 30 $\Omega/\square$ and by setting the line resistance at 30 $\Omega$ or less, preferably at 15 $\Omega$ to 20 $\Omega$. Further, where the productivity of the photosensor array 100 is neglected, it is possible to obtain a sufficient withstand voltage by setting the sheet resistance at 3 $\Omega/\square$ regardless of the value of the line resistance and the grounding resistance. In other words, in order to realize the absolute value, e.g., about 5 kV or more, of the withstand voltage within an allowable range in which the static electricity accumulated in general in the human body is released to the ground, it is necessary to set the sheet resistance of the static electricity protection conductive layer at about 50 $\Omega/\square$ or less, preferably at 15 to 30 $\Omega/\square$, and to set the line resistance at about 30 $\Omega$ or less, preferably at 15 to 20 $\Omega$, thereby realizing a sufficient withstand voltage and achieving a photosense having a high productivity, a satisfactory light transmittance and a good sensitivity.

In this case, the thickness of the ITO film required for setting the sheet resistance of the static electricity protection conductive layer at about 30 to 50 $\Omega/\square$ is relatively small, i.e., about 50 to 100 nm as apparent from FIGS. 18 and 22. Therefore, it is possible to suppress the marked attenuation of light within the ITO layer so as to make it possible to read the image pattern (fingerprint) of the target object with high read sensitivity characteristics. Also, the throughput is high, and it is possible to increase the withstand voltage by effectively releasing the static electricity charged in the target object. It follows that it is possible to suppress the electrical influence on the photosensor array so as to prevent the malfunction of reading and the breakage in the two dimensional image reading apparatus.

In the embodiment described above, a single static electricity protection conductive layer 23 is formed to cover the entire array region of the photosensor array. However, the two dimensional image reading apparatus of the present invention is not limited to the particular construction described above. For example, it is possible for the static electricity protection conductive layer to be formed of a pair of electrode layers having patterns of a predetermined shape. The specific construction of the particular modification will now be described.

Figure 23:
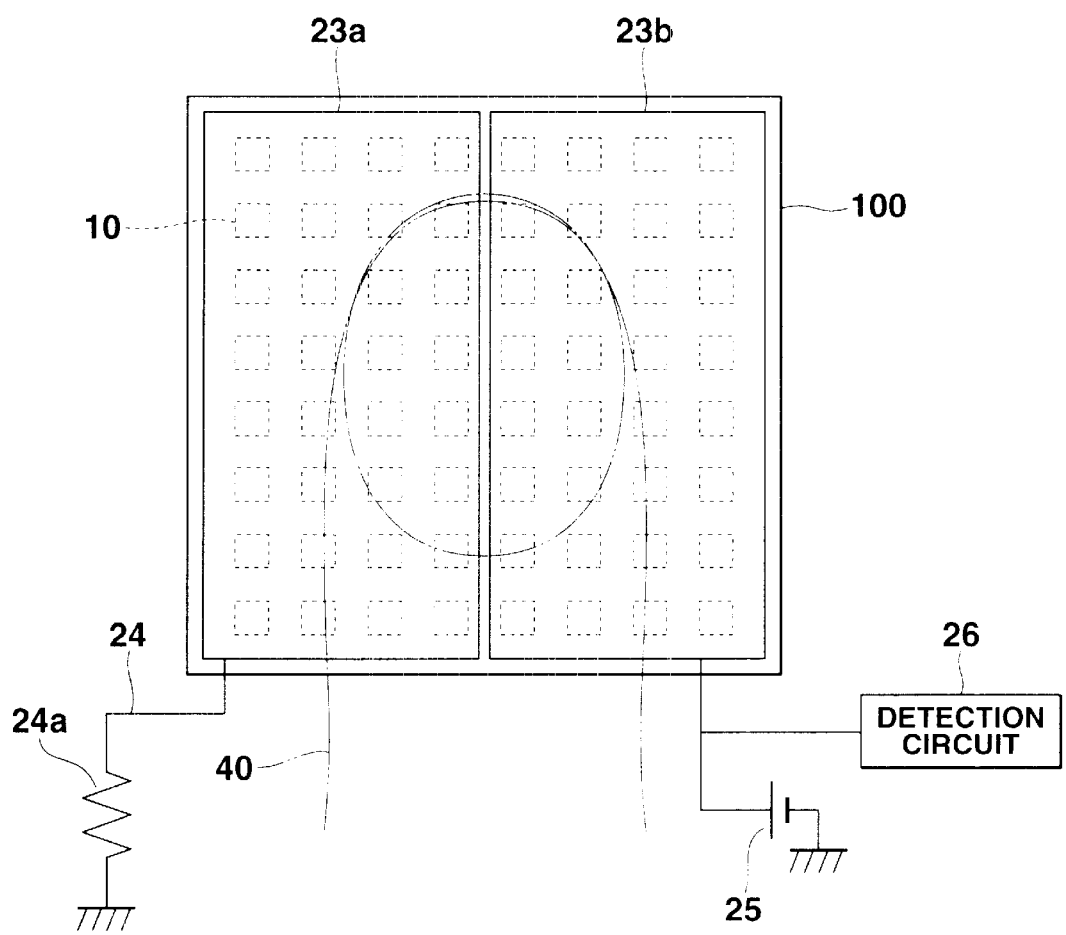
FIG. 23 is a view schematically showing the construction of a two dimensional image reading apparatus according to another embodiment of the present invention.
Figure 24:
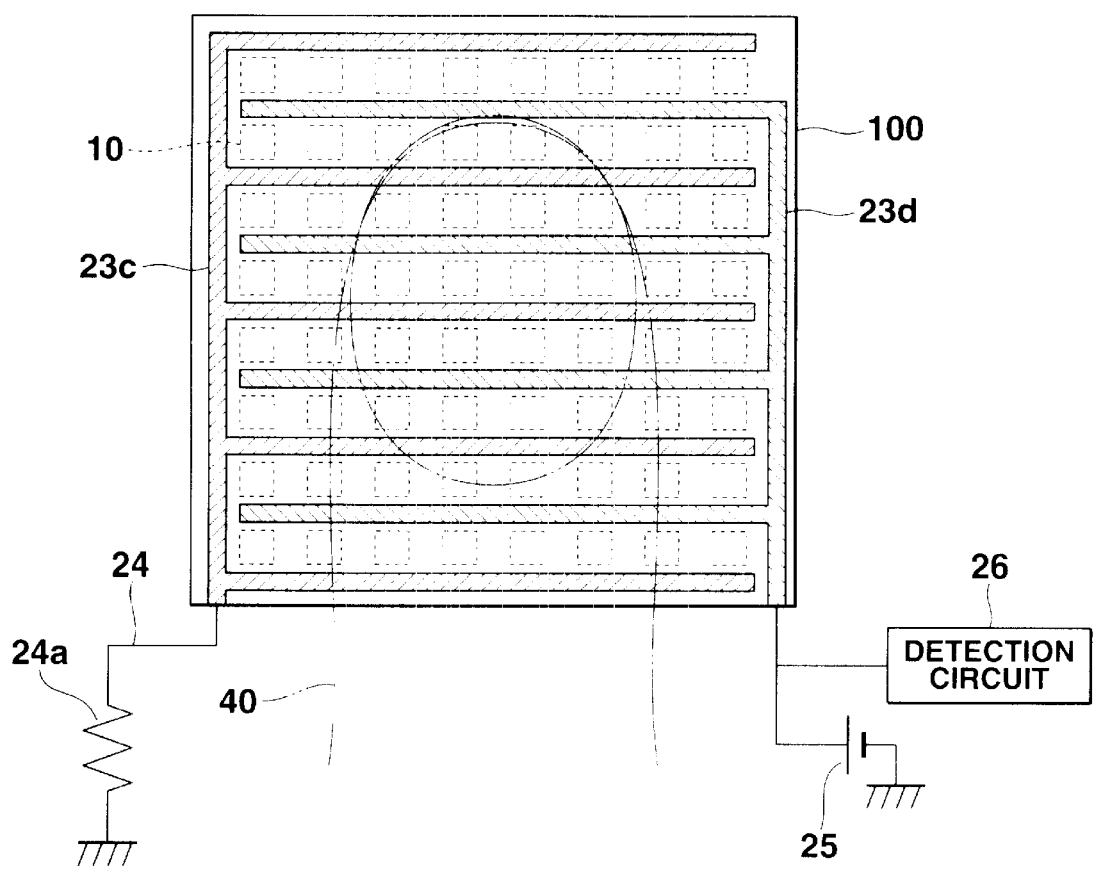
FIG. 24 is a view schematically showing the construction of a two dimensional image reading apparatus according to still another embodiment of the present invention.

Each of FIGS. 23 and 24 schematically shows the construction of a two dimensional image reading apparatus according to another embodiment of the present invention. The members of the apparatus common with the first embodiment and embodiments shown in FIGS. 23 and 24 are denoted by the same reference numerals so as to avoid an overlapping description.

In the two dimensional image reading apparatus shown in FIG. 23, the static electricity protection conductive layer formed on the photosensor array 100 includes a pair of rectangular electrode layers 23a and 23b positioned apart from each other with a small clearance provided therebetween in a manner to divide the array region into two sections. For example, one electrode layer 23a is electrically connected to the ground potential point via a drawing wiring or line 24. The other electrode layer 23b is connected to a power source 25 for applying a predetermined DC voltage or a weak AC signal voltage. Also, a detection circuit 26 for detecting the change in the applied voltage is connected to the electrode layer 23b. If a change in the DC voltage or the weak AC signal voltage is detected when the finger is brought into contact with both the electrode layers 23a and 23b, the detection circuit 26 supplies a starting signal for starting the driving of the photosensor system to an arithmetic processing circuit. Also, upon receipt of the starting signal, the arithmetic processing circuit supplies control signals φtg, φbg and Vpg to the top gate driver 110, the bottom gate driver 120 and the drain driver 130, respectively. It should be noted that at least one of the electrode layers 23a and 23b is formed of a transparent conductive material such as ITO, and the thickness of the electrode layers 23a, 23b is set to allow the electrode layers to exhibit a sheet resistance not higher than about 50 $\Omega$ as in the first embodiment described previously. Further, the line resistance of each of the electrode layers 23a and 23b is set at about 30 $\Omega$ or less.

In the two dimensional image reading apparatus shown in FIG. 24, the static electricity protection conductive layer formed on the photosensor array 100 includes a pair of electrode layers 23c and 23d each shaped like a comb and arranged such that the teeth of one of these electrode layers 23c and 23d are positioned within the clearances between the adjacent teeth of the other electrode layer with a small clearance left between the adjacent teeth of the electrode layers 23c and 23d. For example, one electrode layer 23c is electrically connected to the ground potential point via the drawing wire 24, and the other electrode layer 23d is connected to the power source 25 for applying a predetermined DC voltage. Further, the detection circuit 26 for detecting a change in the applied voltage is connected to the electrode layer 23d.

It is desirable for each of the electrode layers 23c and 23c to be formed of a transparent conductive material such as ITO as in the first embodiment described previously. It is also desirable for the thickness of each of these electrode layers 23c and 23d to be determined such that each of these electrode layers exhibits a sheet resistance not higher than 50 $\Omega$. Further, it is desirable for the line resistance of each of these electrode layers 23c and 23d to be set at about 30 $\Omega$ or less. It should also be noted that, since the electrode layers 23c and 23d are arranged not to overlap with the double gate type photosensors 10, it is possible for the electrode layers 23c, 23d to consist of opaque conductive layers having a low resistivity as far as the light emitted from the back light system 30 is sufficiently incident on the finger through the portions excluding the electrode layers 23c and 23d.

If the target object such as a finger FN is disposed on the electrode layers in a manner to bridge the pair of the electrode layers 23a and 23b or the pair of the electrode layers 23c and 23d, the static electricity charged in the finger FN (human body) is released, and the detection circuit 26 detects a change in voltage caused by the short-circuiting between the electrode layers 23a and 23b or between the electrode layers 23c and 23d so as to judge the presence or absence of the finger FN on the photosensor array 100. As a result, the control signals for controlling the operations of the top gate driver 110, the bottom gate driver 120 and the drain driver 130 shown in FIG. 3 are supplied from the arithmetic process circuit. The detection circuit also performs the switching function for irradiating the finger FN with the light La emitted from the back light system 30 shown in FIG. 14.

In the two dimensional image reading apparatus of the particular construction described above, the target object to be detected such as the finger is disposed to contact both the pair of the electrode layers 23a, 23b or the pair of the electrode layers 23c, 23d, each pair constituting the static electricity protection conductive layer. As a result, the static electricity charged in the target object is released to the ground potential point through the electrode layers 23a, 23c having a lower resistivity and drawing line 24 having a lower resistivity. Also, the contact state of the target object is detected by the detection circuit 26, with the result that the reading operation of the image pattern (fingerprint) of the target object is automatically executed and controlled on the basis of the drive control method shown in FIG. 4.

As described above, the present invention provides a two dimensional image reading apparatus, which permits sufficiently releasing the static electricity charged in the finger FN (human body), permits suppressing the malfunction of reading and the breakage of the photosensor device 100 of the two dimensional image reading apparatus so as to improve the resistance to the static electricity, and also permits automatically executing the image reading operation by the disposition of the target object.

Figure 25:
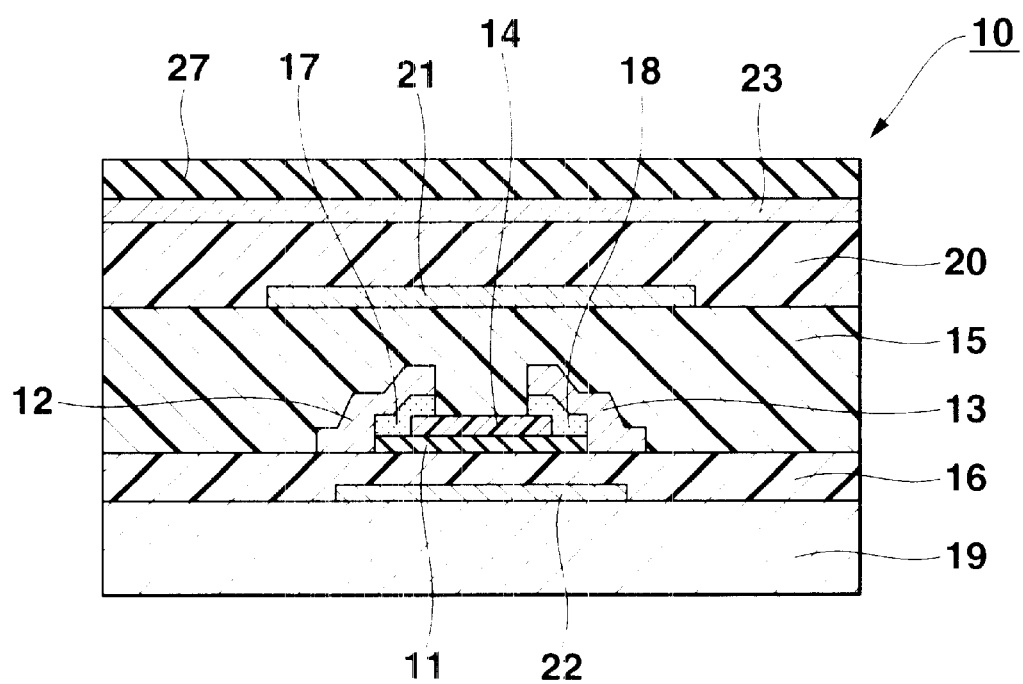
FIG. 25 is a cross sectional view schematically showing the basic construction of a double gate type photosensor, in which an impact alleviating layer is formed on the static electricity protection conductive layer.

Also, in the photosensor device 100 in each of the embodiments described above, the target object such as a finger is brought into direct contact with the static electricity protection conductive layer 23. However, it is also possible to mount an impact alleviating layer 27 made of a transparent material having a low electrical conductivity such as a semiconductor or an insulating material on the static electricity protection conductive layer 23, as shown in FIG. 25.

The impact alleviating layer 27 is of a single layer structure or has a plurality of layers made of, for example, an amorphous silicon and serves to alleviate the shock of release of the static electricity from the finger when the finger charged with a static electricity is brought into contact with the photosensor. It follows that it is possible to improve the withstand voltage of the double gate type photosensor 10 and the photosensor device 100 caused by the static electricity and, thus, to alleviate the unpleasantness felt by the human being when the static electricity is released.

The amorphous silicon forming the impact alleviating layer 27 has a resistivity of about $10^6$ to $10^8$ $\Omega \cdot cm$, and the impact alleviating layer 27 can be formed by the known film-forming method such as a plasma CVD method on the static electricity protection conductive layer 23. In view of the transmittance and the resistance value, it is desirable for the impact alleviating layer 27 to be formed in a thickness of about 25 to 100 nm. It is also desirable for each of the impact alleviating layer 27 and the static electricity protection conductive layer 23 to exhibit at least about 75% of the transmittance of the excited light generated from the semiconductor layers 11. Further, the material of the impact alleviating layer 27 is not limited to an intrinsic amorphous silicon. It is also possible for the impact alleviating layer 27 to be formed of a material selected from the group consisting of an amorphous silicon containing an impurity, silicon nitride, silicon oxide, diamond, an insulated polymer film and a conductive polymer film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An image reading apparatus for reading an image of a target object comprising:
    a plurality of sensors arranged on one side of a substrate;
    an insulating film formed to cover said plurality of sensors; and
    a conductive layer formed on said insulating film for releasing the voltage charged in said target object, said conductive layer having a sheet resistance of 50 $\Omega/\square$ or less.

2. The image reading apparatus according to claim 1, wherein said conductive layer is formed of a conductive material capable of transmitting light.

3. The image reading apparatus according to claim 1, wherein said conductive layer is formed of a material containing indium.tin oxide as a main component.

4. The image reading apparatus according to claim 1, wherein said conductive layer is connected to the ground via a wiring.

5. The image reading apparatus according to claim 4, wherein said wiring has a line resistance not higher than 30 $\Omega$.

6. The image reading apparatus according to claim 1, wherein said sensor includes a photosensor.

7. The image reading apparatus according to claim 6, wherein said photosensor comprises a semiconductor layer having an incidence effective region on which an excited light is incident, source and drain electrodes formed on both edge sides of said semiconductor layer, a first gate insulating film formed under said semiconductor layer, a first gate electrode formed under said first gate insulating film, a second gate insulating film formed above said semiconductor layer, and a second gate electrode formed on said second gate insulating film.

8. The image reading apparatus according to claim 7, further comprising a detection circuit for detecting a change in the DC voltage or a change in the AC signal voltage when said target object is brought into contact with said conductive layer.

9. The image reading apparatus according to claim 1, wherein said conductive layer is divided into a plurality of sections.

10. The image reading apparatus according to claim 9, wherein at least one of sections is connected to the ground.

11. An image reading apparatus for reading an image of a target object to be detected, comprising:
    (a) a plurality of photosensors arranged on one surface of a substrate, each of said photosensors including a semiconductor layer having an incident effective region on which an excited light is incident, a source electrode and a drain electrode formed on both edge sides of said semiconductor layer, a first gate insulating film formed below said semiconductor layer, a first gate electrode formed under said first gate insulating film, a second gate insulating film formed above said semiconductor layer, and a second gate electrode formed above said second gate insulating film;
    (b) an insulating film formed to cover said plural sensors;
    (c) a conductive layer formed on said insulating layer for releasing the voltage charged in said target object, said conductive layer having a sheet resistance not higher than 50 $\Omega/\square$;
    (d) a drain driver connected the drain electrodes of said plural photosensors;
    (e) a first gate driver connected to the first gate electrodes of said plural photosensors; and
    (f) a second gate driver connected to the second gate electrodes of said plural photosensors.

12. An image reading apparatus for reading the image of a target object to be detected, comprising:
    a plurality of sensors arranged on one side of a substrate;
    an insulating film formed to cover said plural sensors;
    a conductive layer formed on said insulating film for releasing the voltage charged in said target object, said conductive layer having a sheet resistance not higher than 50 $\Omega/\square$; and an impact alleviating layer formed on said conductive layer.

13. The image reading apparatus according to claim 12, wherein said conductive layer is formed of a conductive material capable of transmitting light.

14. The image reading apparatus according to claim 12, wherein said conductive layer is connected to the ground via a wiring.

15. The image reading apparatus according to claim 14, wherein the line resistance of said wiring is set at 30 Ω less.

16. The image reading apparatus according to claim 12, wherein said conductive layer is divided into a plurality of sections.

17. The image reading apparatus according to claim 12, wherein said sensor comprises a semiconductor layer having an incidence effective region on which an excited light is incident, source and drain regions formed on both side portions of said semiconductor layer, a first gate insulating film formed below said semiconductor layer, a first gate electrode formed under said first gate insulating film, a second gate insulating film formed above said semiconductor layer, and a second gate electrode formed above said second gate insulating film.

18. The image reading apparatus according to claim 12, further comprising a detection circuit for detecting a change in the DC voltage or a change in the AC signal voltage when said target object is brought into contact with said conductive layer.

19. The image reading apparatus according to claim 12, wherein said impact alleviating layer is formed of a material selected from the group consisting of an intrinsic amorphous silicon, an amorphous silicon containing an impurity, silicon nitride, silicon oxide, diamond, an insulated polymer film and a conductive polymer.

* * * * *

UNITED STATES PATENT AND TRADEMARK OFFICE
CERTIFICATE OF CORRECTION

PATENT NO.    : 6,681,992 B2
DATED         : January 27, 2004
INVENTOR(S)   : Tomomi Iihama It is certified that error appears in the above-identified patent and that said Letters Patent is hereby corrected as shown below:

<u>Title page,</u>
Insert Item -- [73] Assignee: Casio Computer Co., Ltd., Tokyo, (JP) --.

Signed and Sealed this

Seventeenth Day of January, 2006

JON W. DUDAS
*Director of the United States Patent and Trademark Office*